United States Patent
Treibergs et al.

[11] Patent Number: 6,162,080
[45] Date of Patent: Dec. 19, 2000

[54] SOCKET FOR POSITIONING AND INSTALLING AN INTEGRATED CIRCUIT ON A CIRCUIT BOARD

[75] Inventors: Valts E. Treibergs; Michael S. Glick, both of South Bend; Kevin L. Young, Roanoke, all of Ind.

[73] Assignee: Wells-CTI, South Bend, Ind.

[21] Appl. No.: 09/299,375

[22] Filed: Apr. 27, 1999

Related U.S. Application Data

[60] Provisional application No. 60/096,577, Aug. 14, 1998.

[51] Int. Cl.[7] .................................................. H01R 11/22
[52] U.S. Cl. ............................................................ 439/268
[58] Field of Search ................................... 439/266, 525, 439/526, 330, 268

[56] References Cited

U.S. PATENT DOCUMENTS

| | | | |
|---|---|---|---|
| 4,422,703 | 12/1983 | Christensen et al. | 439/266 |
| 4,487,465 | 12/1984 | Cherian | 439/266 |
| 4,496,205 | 1/1985 | Christensen et al. | 439/266 |
| 4,618,199 | 10/1986 | Pfaff | 439/266 |
| 4,808,119 | 2/1989 | Pfaff | 439/268 |
| 5,205,756 | 4/1993 | Myers | 439/266 |
| 5,879,169 | 3/1999 | Wu | 439/74 |

*Primary Examiner*—Khiem Nguyen
*Assistant Examiner*—Hae Moon Hyeon
*Attorney, Agent, or Firm*—Baker & Daniels

[57] ABSTRACT

A socket for positioning and installing an integrated circuit on a circuit board includes multiple contacts mounted in a base, each contacts receiving one of the leads which extend from the sides of the integrated circuit. The contacts include a pair of engagement members which are spread apart by spreader members which are forced between the engagement members by operation of an actuating member which is slidably mounted on the base, thereby permitting installation of the leads within the contacts. Upon release of the actuating member, the contact engagement members return to their initial position and engage on opposite sides of the leads, thus providing an electrical connection between the contacts and the leads. The contacts include offset lips on the upper end thereof which permits the engagement surfaces to deflect without interference with adjacent contacts. Contacts also include a contact arm which extends around the bottom wall of the socket and is clamped against the circuit board to provide electrical connections therewith.

26 Claims, 9 Drawing Sheets

SOCKET FOR POSITIONING AND INSTALLING AN INTEGRATED CIRCUIT ON A CIRCUIT BOARD

This application claims benefit to provisional application Ser. No. 60/096,577 Aug. 14, 1998.

This invention relates to a socket for positioning and installing an integrated circuit package on a test circuit board for testing.

Integrated circuits are packaged in standard configurations and include multiple leads extending from one or more sides of the package. Most integrated circuits require extensive testing before being proved for sale and use. Generally, the integrated circuit package is installed in a socket mounted on an integrated circuit test board and the assembly is then placed in an environmental test chamber in which the circuit is subjected to various physical, environmental, and electronic tests. If the integrated circuit successfully passes these tests, it is approved for sale and use.

The leads extending from integrated circuit packages are easily damaged during the test procedure, particularly when the integrated circuit is installed and removed from the test socket. Accordingly, it is desirable that the leads be protected as much as possible during the test procedure, and that they be subjected to minimal stresses. Prior art test sockets include contacts which provide the electrical path between the leads of the integrated circuit and the conductors in the circuit board include members which are deflected to permit installation of the leads of the contacts with a minimal insertion force. Such prior art devices are disclosed in U.S. Pat. Nos. 4,808,119 and 4,618,199.

It is desirable to maximize the contact area between the electrical contacts of the socket and the leads extending from the integrated circuit. Accordingly, the present invention includes contacts mounted in the socket that include a pair of parallel engagement surfaces that engage opposite sides of the leads, thereby providing increased engagement area over that provided by prior art test sockets. It is also necessary to provide contacts in a test socket that have minimal spaces between the contacts, since the leads of the integrated circuit are spaced as closely together as possible and the contacts of the test socket must be correspondingly spaced to engage the leads of the integrated circuit. However, a problem arises in sockets in which the contacts are deflected when the integrated circuit is installed and removed because care must be taken to assure that the deflection of a portion of a contact does not cause the contact to engage any portion of an adjacent contact, as shorting between the contacts would then occur. It is also necessary to provide lips on the tips of the contacts which are engaged by spreader members during installation and removal of the integrated circuit from the socket. According to the present invention, the lips on adjacent contacts are offset from one another, so that the contacts may be placed more closely together without shorting since the lips of the contacts are offset and thus cannot engage one another.

Accordingly to another aspect of the present invention, the contacts include a connective arm which extends around the lower edge of a socket wall and defines a gap therebetween before the socket is installed on a circuit board. When the socket is installed on the circuit board, the contact arm is compressed between the socket wall and the circuit board thereby assuring electrical contact.

These and other advantages of the present invention will become apparent from the following description with reference to the accompanying drawings, in which:

Referring now to the drawings, a socket generally indicated by the numeral 10 includes a base 12 and a top 14 which is slidably mounted on the base 12 for substantially vertical movement with respect thereto. The base 12 includes an upper base member 15 consisting of a substantially horizontal pad 16 upon which an integrated circuit 18 rests when the integrated circuit 18 is installed in the socket 10 for testing. The pad 16 is connected to an upstanding side wall 20 by connecting portions 22 at the ends of longitudinally extending slots 24, 26, which extend substantially parallel to one another along opposite sides of the pad 16. The top 14 includes side walls 28, each of which includes surfaces 30 which slide with clearance relative to corresponding surfaces 32 on the side walls 20 of the base. Side walls 20 includes an inwardly projecting portion 33 which engages inwardly extending shoulder 34 on side walls 20 and urged thereagainst by springs 36 mounted between the top and the base. The side walls 28 of top 14 includes an outwardly extending portion 38 which engages upper surface 40 on side walls 20 when the top 14 is moved downwardly against the bias of the springs 36 as will hereinafter be explained. The side walls 20 further include a lower surface 42 opposite the upper surface 40 that is clamped over the circuit board 44 when the socket 10 is installed thereon. End portions 46 of the top 14 extend between the side walls 28 and include a tab 48 against which the springs 36 bear. Recesses 50 defined in the end portions 46 receive projections 52 extending from base 12. The projections 52 prevent the integrated circuit 18 from sliding under the top 14.

The integrated circuit 18 includes multiple, parallel leads 54 which extend from opposite sides of the integrated circuit 18. The width of the pad 16 is such that when the integrated circuit 18 is installed thereon, the leads 54 extending from opposite sides of the integrated circuit 18 project over the slots 24 on opposite sides of the pad 16. Multiple electrical contacts generally indicated by the numeral 56 are mounted substantially parallel to one another on the base 12 as will hereinafter be described, and project into the slots 24.

Referring now to FIGS. 10–13, the contacts 56 are made of a resilient electrically conductive material, and include a pair of engagement members 58, 60 which are offset from one another by a connecting portion 61 which interconnects the lower edge of the engagement members 58, 60. It will be noted that the engagement members 58, 60 do not contact one another. Substantially parallel barbs 62, 64 include inwardly tapering portions 65 and extend into the gap G defined between the engagement surfaces 58 and 60 via inwardly tapering portions 65. The engagement members 58 and 60 include forwardly extending arms 66, 68 that project from portion 70 of the engagement members 58, 60, the portions 70 being connected by the connecting portion 61. Since the arms 66, 68 are connected only through the portions 70 and the connecting portion 61, the arms 66, 68 may be deflected outwardly with respect to one another, thereby increasing the width of the gap G between the arms 66, 68. The arm 68 terminates in an outwardly projecting lip 72. The arm 66 includes an off set portion 74 that extends beyond the edge of the arm 68. The off set portion 74 terminates in an outwardly projecting lip 76 which projects outwardly with respect to the gap G, but the portion of the arm 66 which is overlapped by the arm 68 terminates in a flat surface 78. As will be explained hereinafter, the lip 72 of an adjacent contact 56 is able to deflect over the flat surface 78 without interfering with the lip 76 and the lip 76 is able to deflect over the flat surface 80 of an adjacent contact without interference with the lip 72. Accordingly, the contacts 56 may be placed sufficiently close together that the closely separated leads can be engaged with their corresponding contacts without the contacts shorting out by engaging one another. The contacts 56 further include a contact arm generally indicated by the numeral 82 that extends from the end of the connecting portion 61. Contact arm 82 includes a downwardly tapering portion 84, an off set portion 86 which is offset from the downwardly tapering portion 84 by an off set 88, and an upwardly projecting lip 90.

Base 12 includes a bottom plate 92 which is secured below the pad 16 by fasteners 94. Fasteners 94 are provided with internal screw threads 96 that accept a fastener 98 which extends through the circuit board 44 to secure the socket thereto. Socket 10 is also provided with downwardly extending bosses 100 that are received in corresponding apertures (not shown) on the circuit board 44 to assist in locating the socket 10 in the proper position with respect to the circuit board 44. The bottom plate 92 is provided with undercuts 102 extending longitudinally along both edges thereof parallel to the slots 24 and which cooperate with corresponding undercuts 104 on the underside of the pad 16 to define substantially parallel grooves 106. Before the bottom plate 92 is installed below the pad 16, the contacts 56 are installed in the grooves 106, with the barbs 62 of each contact 56 being received within a corresponding socket aperture 108. A row of socket apertures 108 extends parallel to each of the slots 24 to receive the barbs 62 of each corresponding contact 56. Because of the engagement of the barbs 62,64 in the socket apertures 108 and the mounting of portions 70 of the contacts 56 within the groves 106, the contacts 56 are positioned and clamped in place to receive the leads 54.

Figure 9:
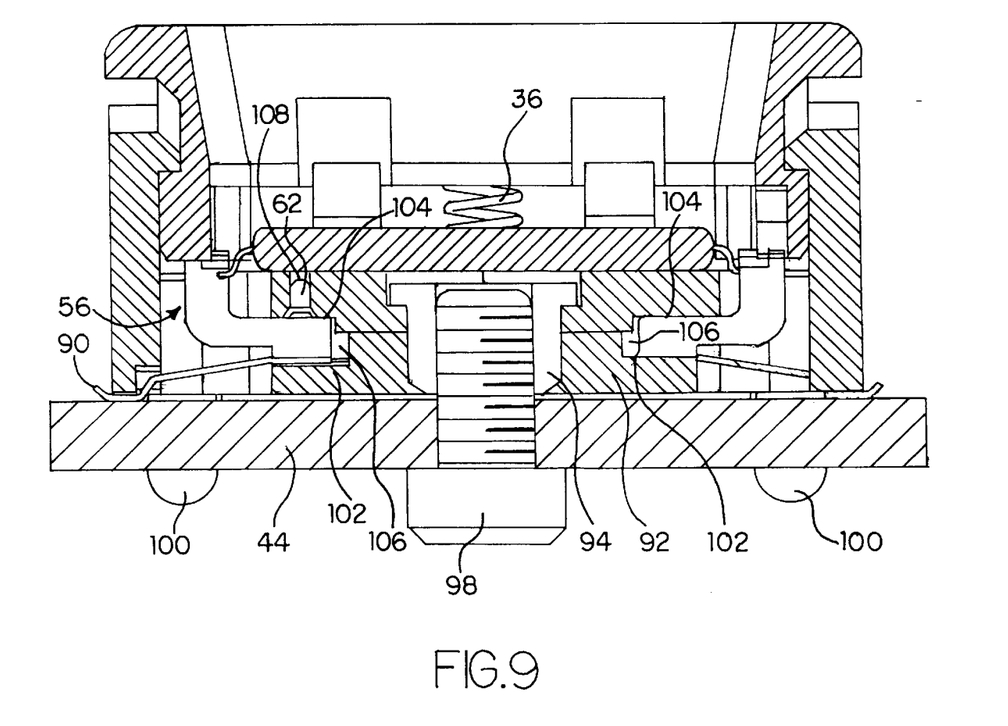
FIG. 9 is a view similar to FIG. 8, but illustrating the socket installed on a circuit board and with an integrated circuit installed within the socket.
Figures 10, 11, 12, 13:
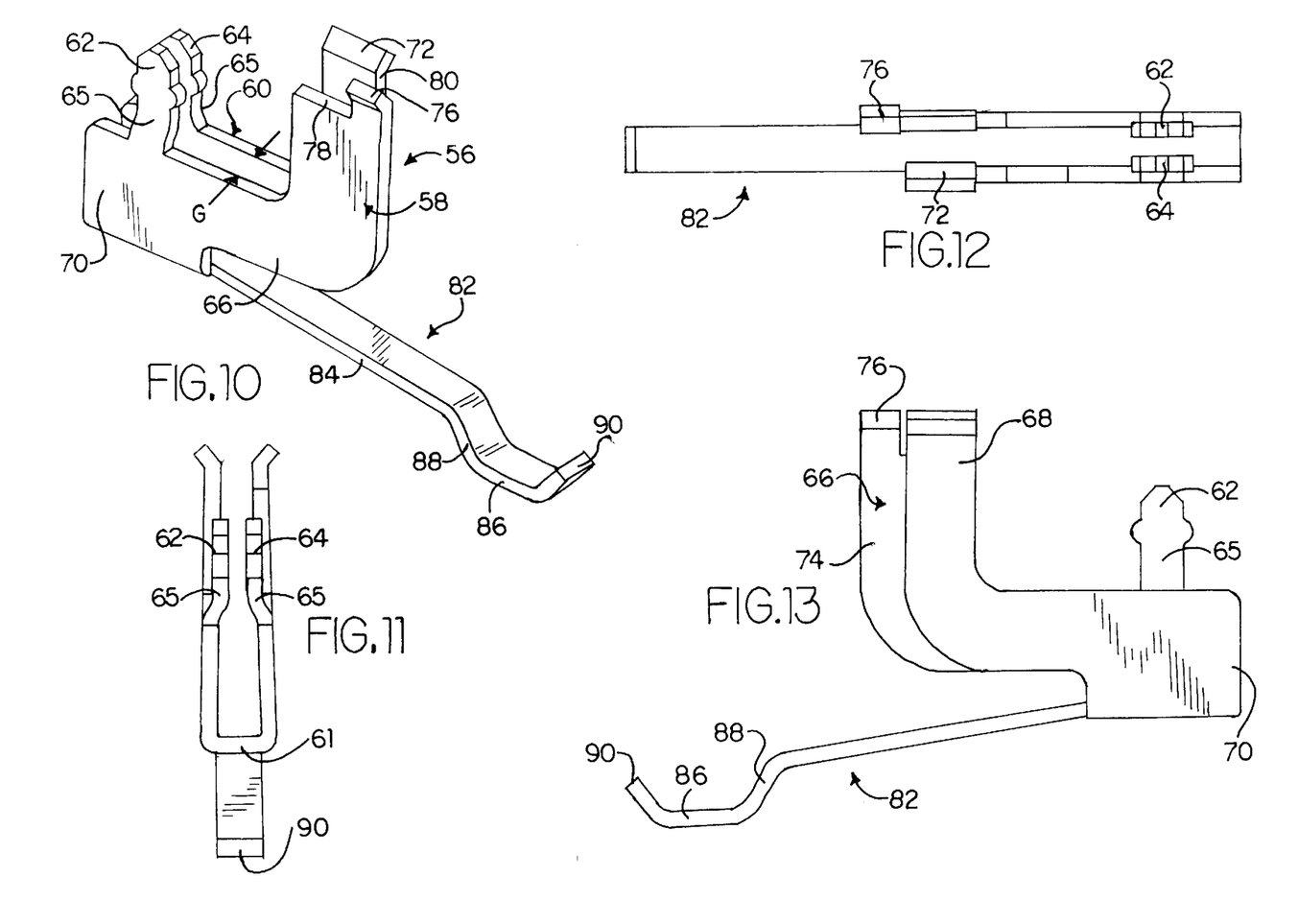
FIG. 10 is a view in perspective of one of the contacts used in the socket illustrated in FIGS. 1–9.
FIG. 11 is a end view taken from the left side viewing FIG. 10, of the contact illustrated in FIG. 10.
FIG. 12 is a top view of the contact illustrated in FIG. 10–11.
FIG. 13 is a side view of the element illustrated in FIGS. 10–12.

When the contacts 56 are installed in the grooves 106, the contact arm 82 of each contact 56 extends across the corresponding slot 24 and the offset portion 86 of which cooperates with the lower surface 42 of the wall 20 define a gap H therebetween prior to installation of the socket 10 on the circuit board 44. As illustrated in FIG. 9, after installation of the socket on the circuit board, the resiliency of the contact arm 82 permits the offset portion 86 to be clamped between the lower surface 42 and the circuit board 44, thereby assuring that proper electrical contact is made between the contact arm and the conductors (not shown) as in the circuit board 44.

The top 14 carries rows of equally spaced spreader members 110 which extend above each of the contacts 56. Each of the spreader members 110 include a body portion 112 which is wider than the gap G and converging wedging surfaces 114 extending from body portion 112 and which are adapted to engage the lips 72, 76 as the top 14 is lowered, as will be explained hereinafter.

Figure 1:
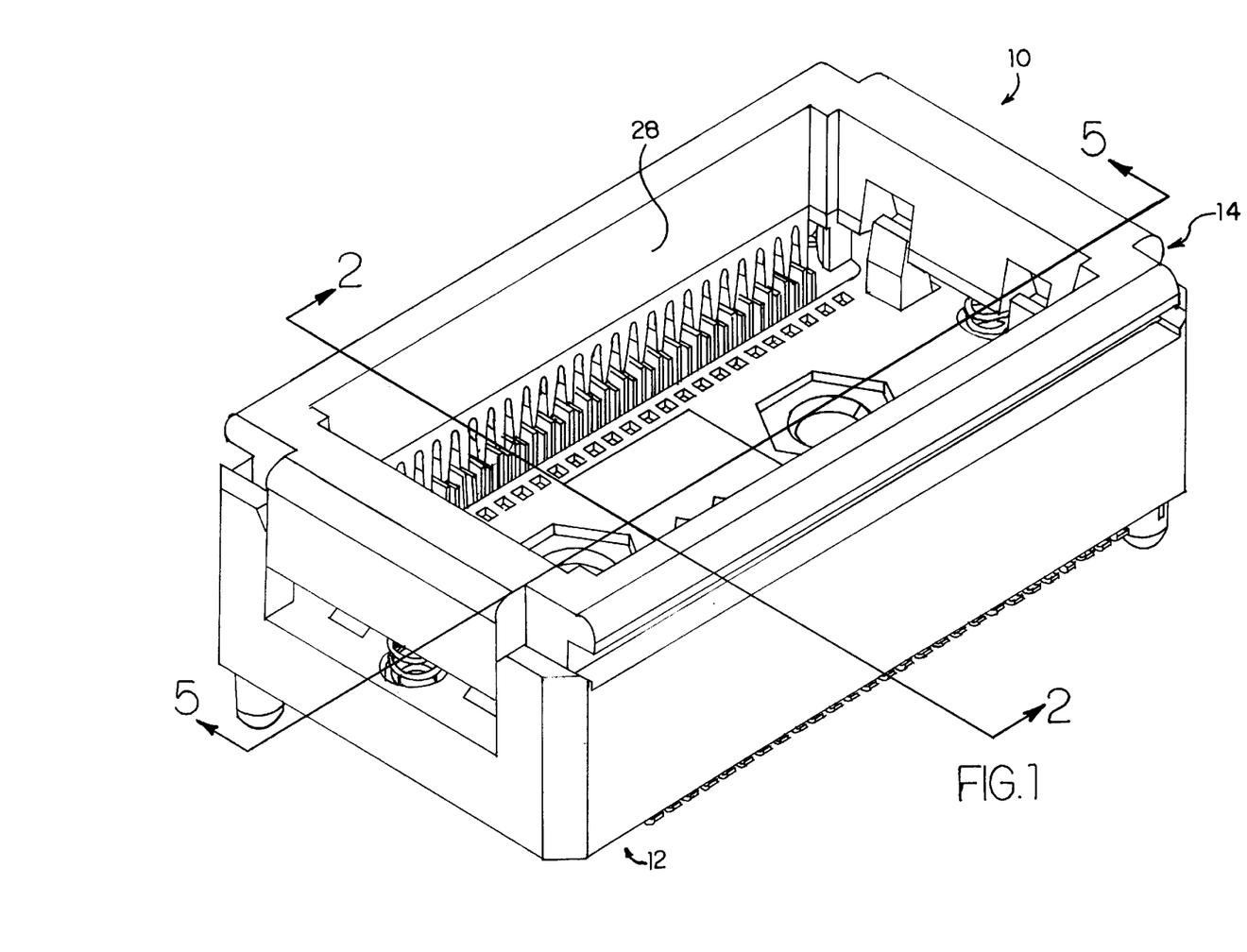
FIG. 1 is a view is perspective of a test socket made pursuant to the teachings of the present invention.
Figure 2:
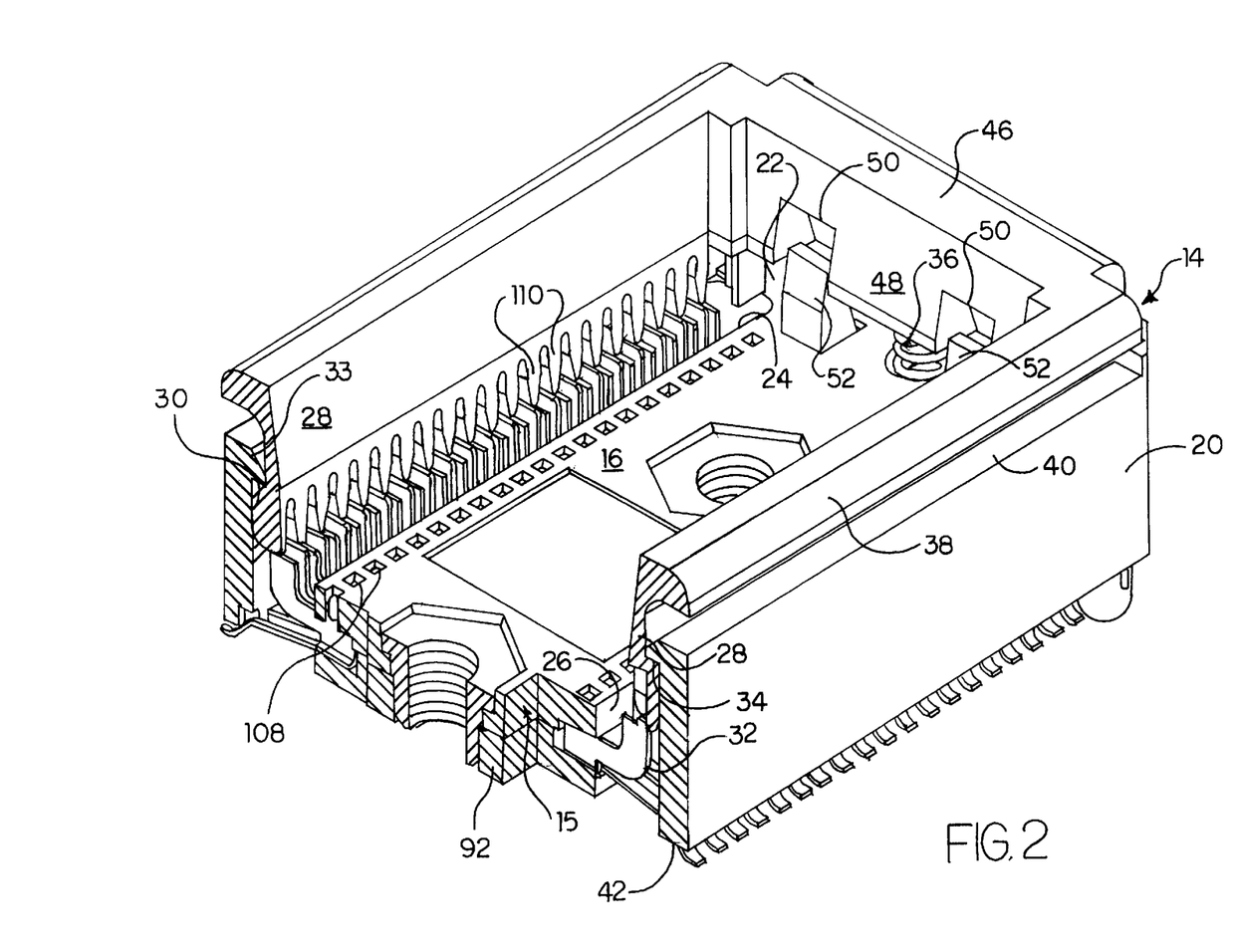
FIG. 2 is a cross sectional view in perspective, taken substantially along lines 2—2 of FIG. 1.
Figure 3:
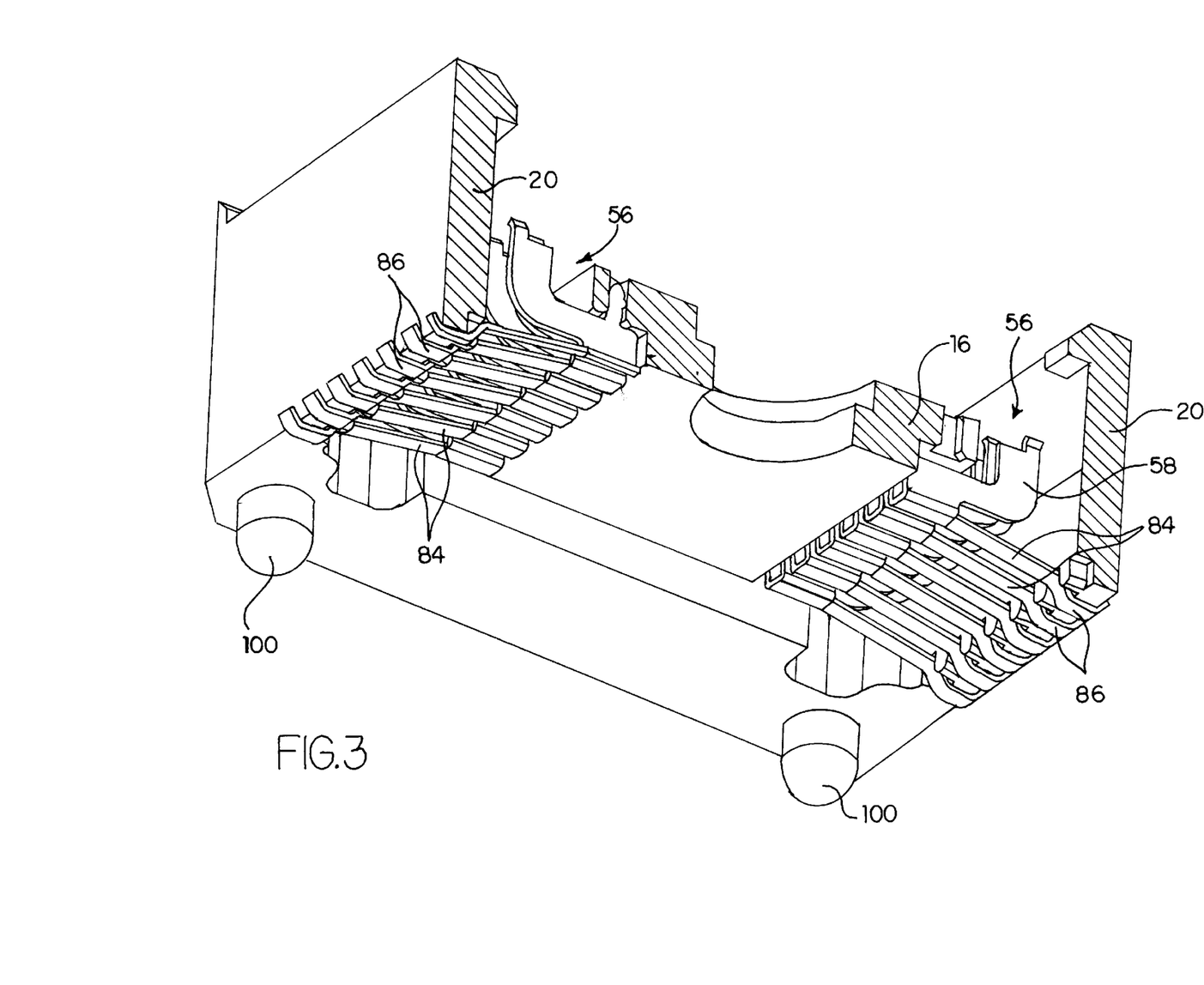
FIG. 3 is a cross sectional view in perspective, similar to FIG. 2, but taken from below, of the test socket illustrated in FIGS. 1 and 2, but with the bottom plate removed.
Figure 4:
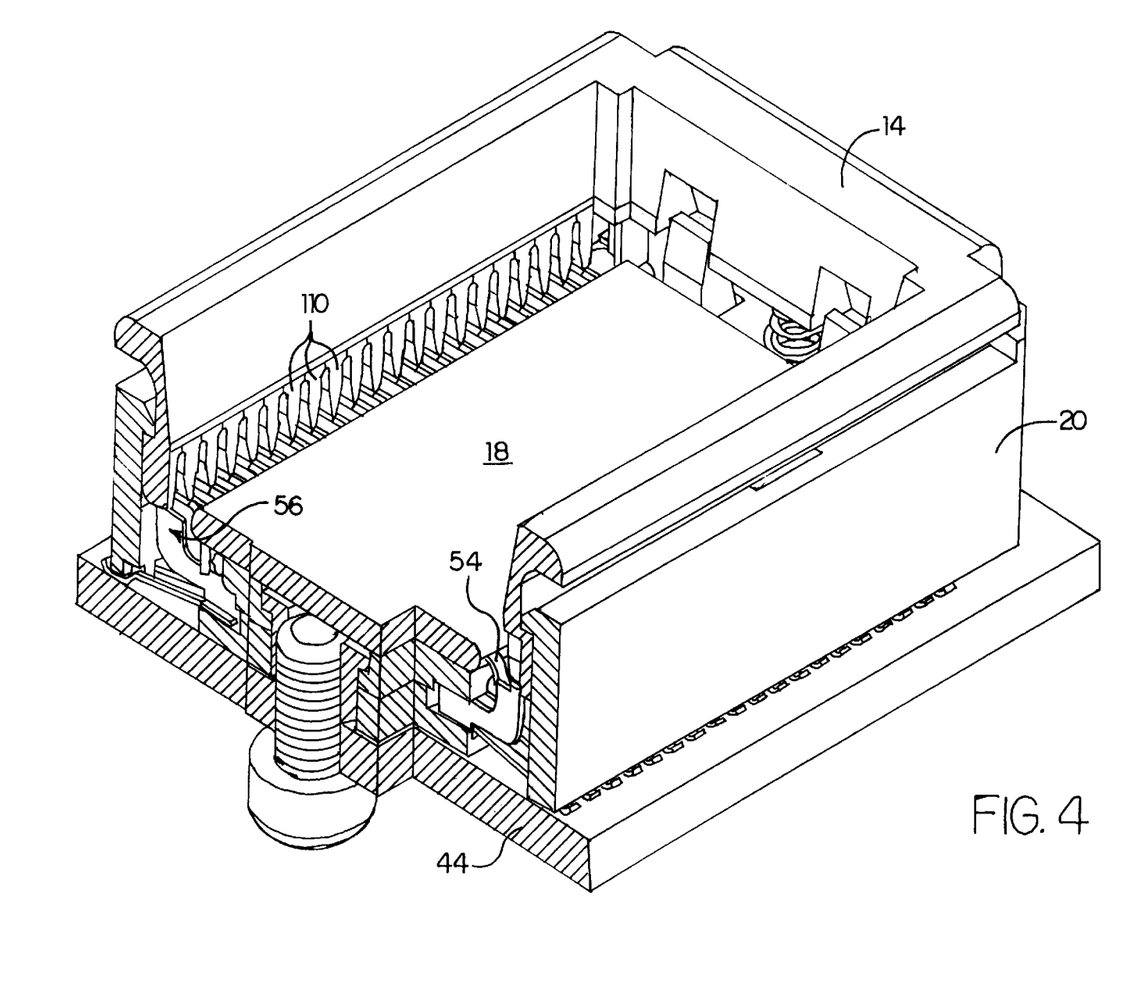
FIG. 4 is a cross sectional view similar to FIG. 2, but illustrating the socket of the present invention installed on a circuit board and with an integrated circuit installed within the socket for testing.
Figure 5:
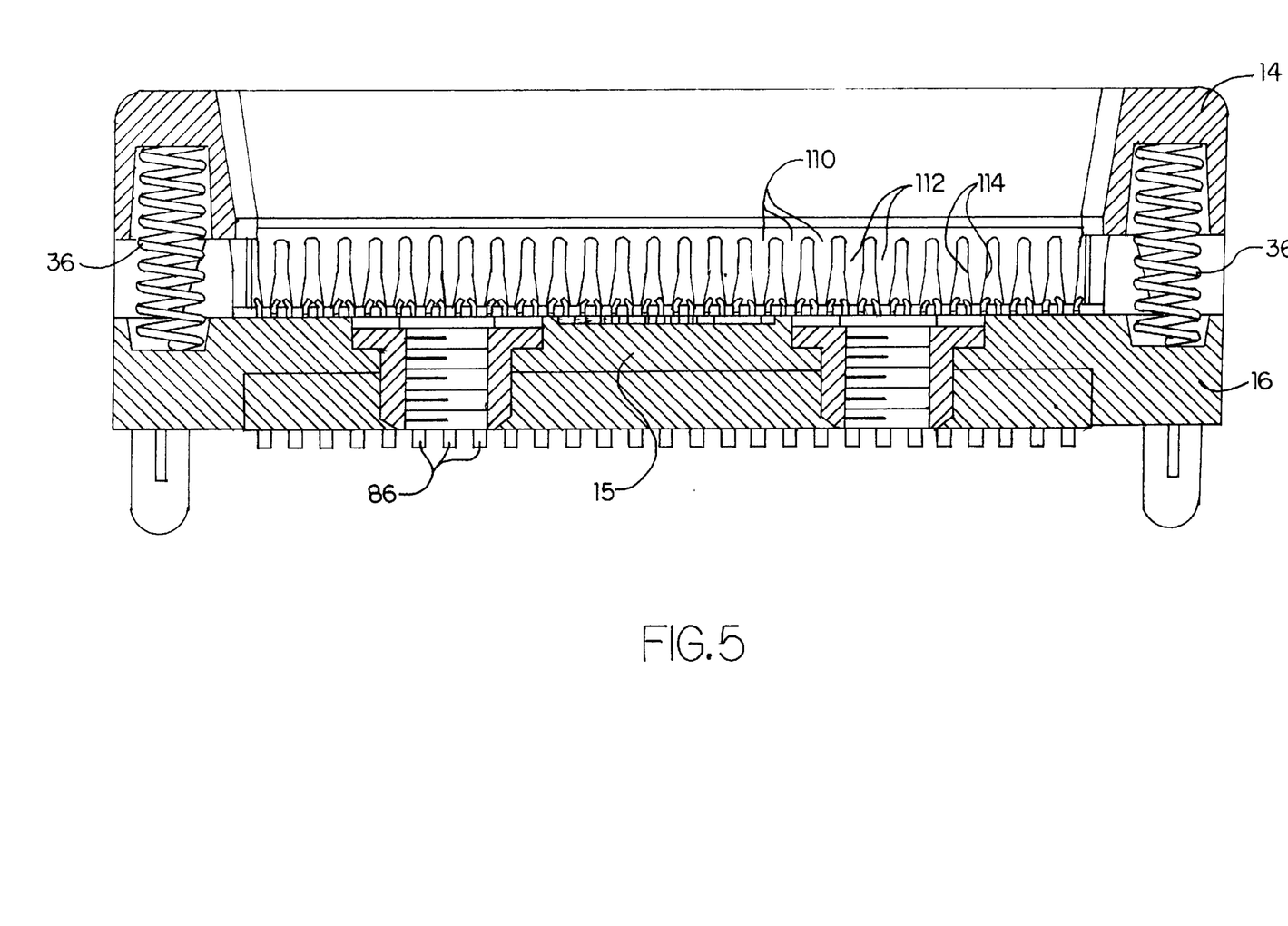
FIG. 5 is a cross sectional view taken substantially along lines 5—5 of FIG. 1.
Figure 6:
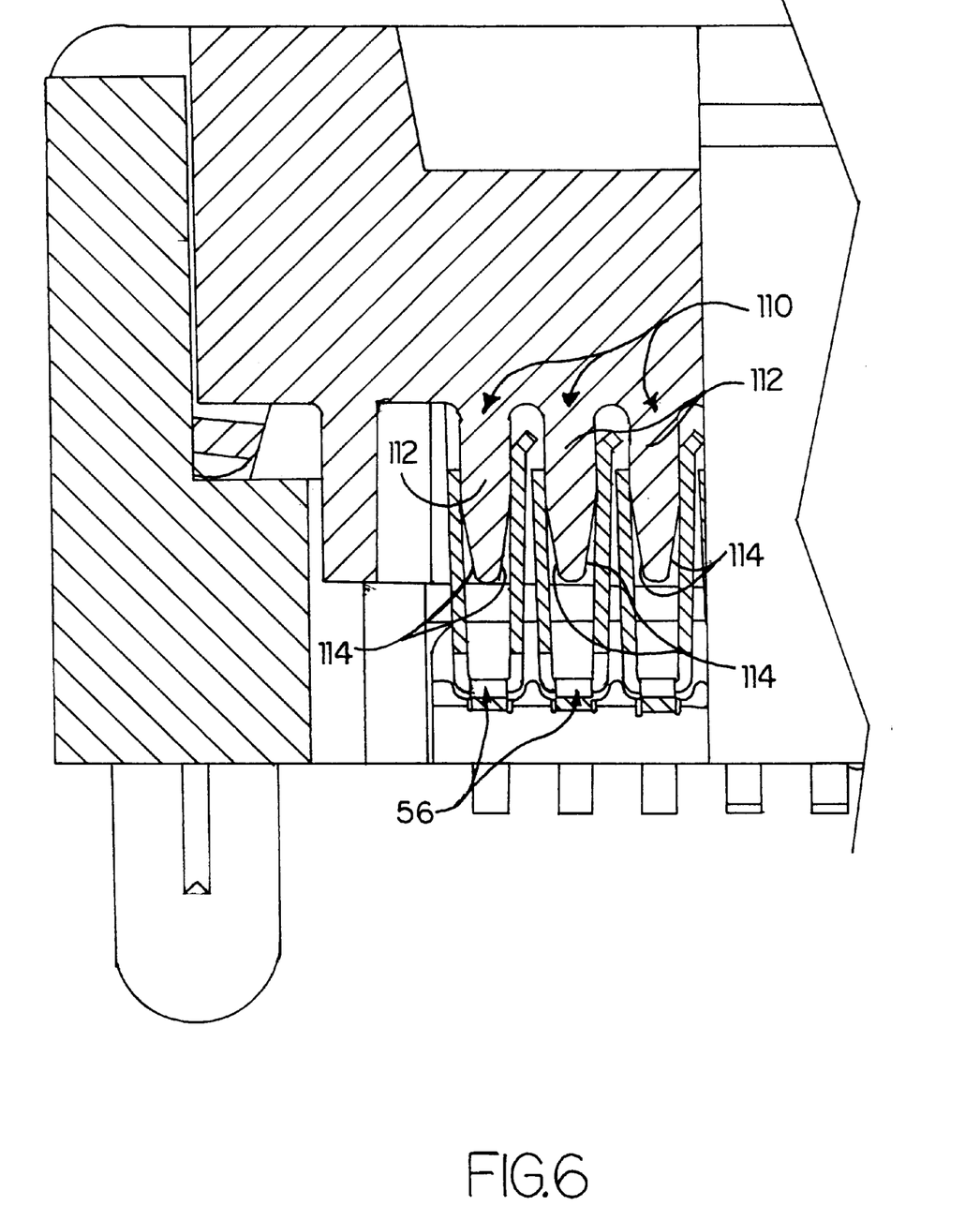
FIG. 6 is an enlarged, fragmentary, cross sectional view of a portion of the contacts of the socket illustrated in FIGS. 1–5, illustrated with the top of the socket depressed to spread the engagement members of the contacts.
Figure 7:
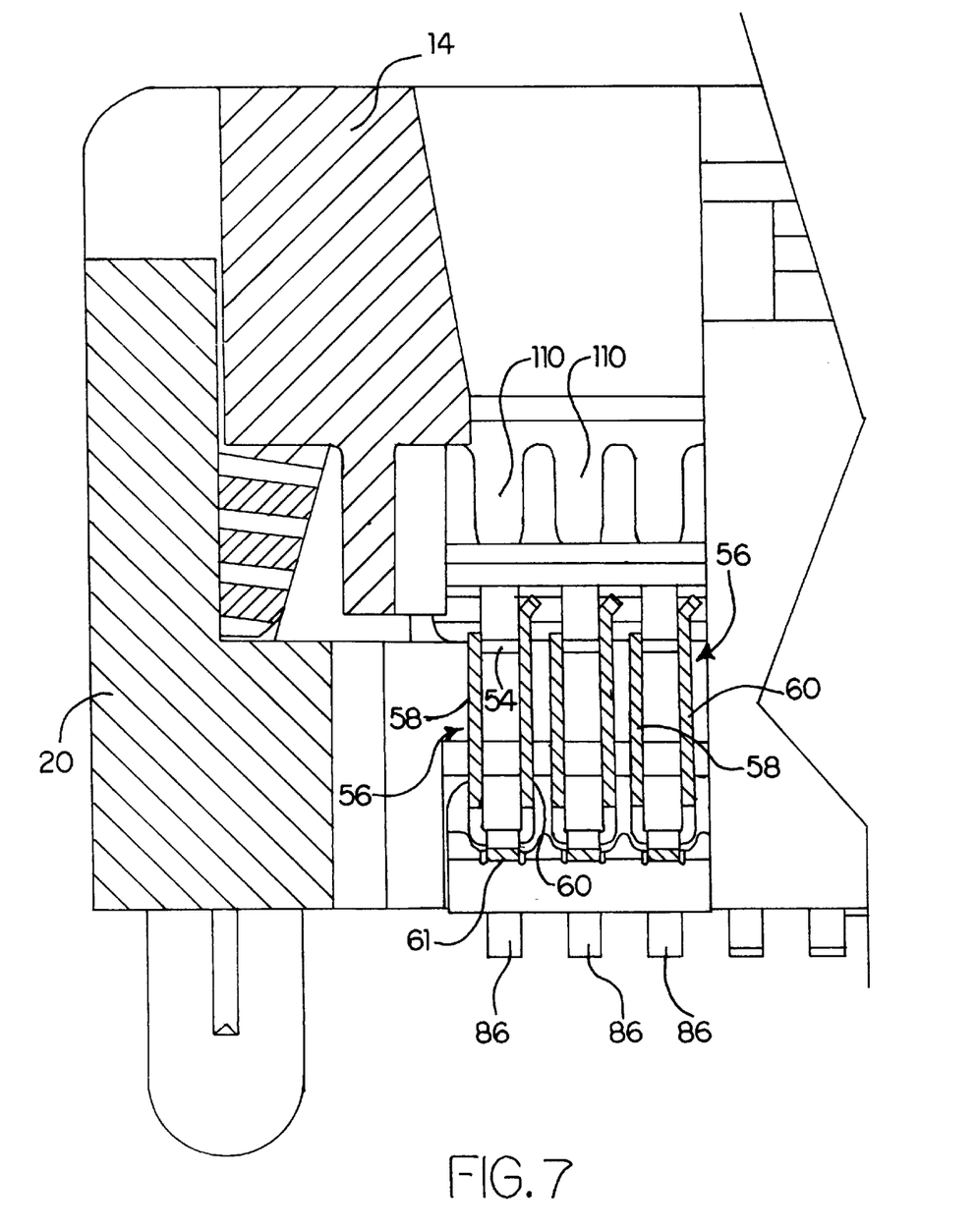
FIG. 7 is a view similar to FIG. 6, but illustrating the top of the socket released and with the integrated circuit leads engaged with the contacts.
Figure 8:
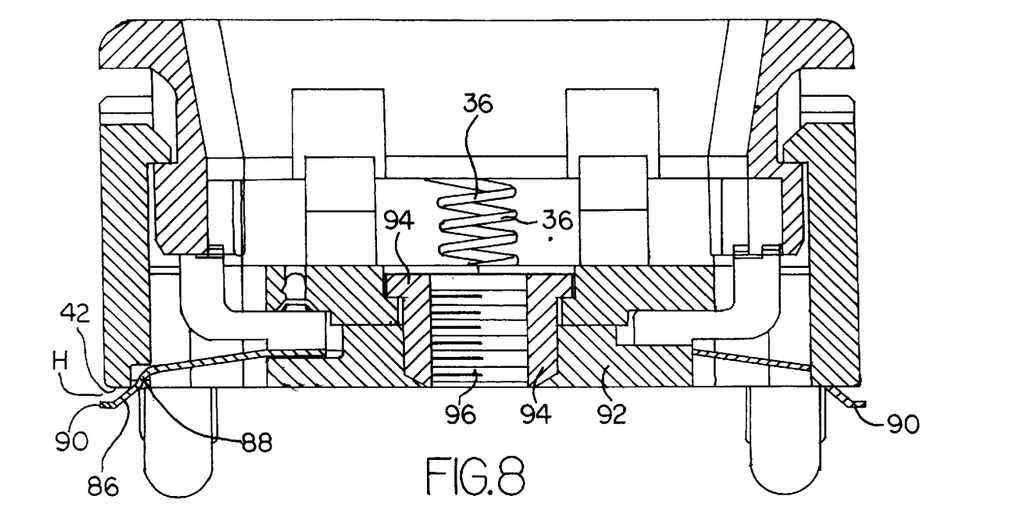
FIG. 8 is a transverse, cross sectional view taken through the socket illustrated in FIG. 1.

In operation, the top 14 is pushed downwardly when the user desires to install an integrated circuit in the socket. Downward movement of the top 14 drives the spreader members 110 into the gap G defined between the engagement members 58, 60 of corresponding contacts 56. The portions 70 of each of the contacts 56 are prevented from spreading because of the interconnection provided by the connecting portion 61 and because the barb 62, 64 are received in the socket apertures 108. However, the arms 66, 68 extend within the corresponding slot 24 and are made out of resilient, flexible material. Accordingly, as the spreader members are forced downwardly, the wedging sections 114 engage the lips 72, 76 of the corresponding contact member and are guided into the gap G thereby. Further downward movement of the top 14 causes body portions 112 to enter the gap G, thereby spreading the arm 66, 68 apart as illustrated in FIG. 6. It will be noted that, because of the off set between the lip 72, 76, the lips of adjacent contact do not interfere with one another as discussed above. Accordingly, the contacts 56 may be spaced closely together to correspond with the spacing of the leads 54 of the integrated circuit. While holding the top down, the integrated circuit is placed on the pad 16 and located in its proper position by the projections 52. The leads extending from both sides of the integrated circuit are then received in their corresponding contact. Accordingly, the leads are protected from damage. The top 14 is then released, withdrawing the spreading numbers 110 from the contacts and permitting the resiliency of the arms 66, 68 to return the arms to their normal condition illustrated in FIG. 7. It will be noted that the leads 54, as illustrated in FIG. 7, clamped tightly by the arms 66, 68 of each corresponding contact. The space between the arms is designed such that both sides of the leads 54 are engaged by the arms, thus maximizing the contact area between the leads and the contacts, to assure a proper electrical connection between the leads and the contacts as illustrated in FIG. 7. After the top 14 is released, the springs 36 return the top 14 to its uppermost position. When the integrated circuit is to be removed from the socket, the top 14 is depressed, causing the spreader members 110 to again spread the fingers 66, 68, permitting removal of the leads from the contents and accordingly permitting integrated circuit to remove from the socket. It will be noted that the spreader members 110 engage a portion of the contacts 56 which is offset from the portion of the contacts 56 engaged by the leads, so that no interference occurs between the leads and spreading members of operation of the socket.

What is claimed is:

1. A socket positioning and installing an integrated circuit on a circuit board, said integrated circuit having multiple, parallel leads having a pair of opposing contact surfaces, said leads extending from one side of the integrated circuit, said socket comprising a base, multiple electrically conductive contacts mounted on said base and electrically connected independently of the other contacts to the circuit board and including one contact for each of said leads, each of said contacts including a pair of offset, resilient, parallel, engagement members defining a gap therebetween for receiving a corresponding lead when the integrated circuit is installed in the socket and a connecting member connecting said engagement members and extending across said gap, each of said engagement members yieldably engaging a contact surface of said corresponding lead when the integrated circuit is installed in the socket, and a top slidably mounted on said base and movable toward and away from said contacts, said top including electrically nonconductive spreader members engaging both of said engagement members of each contact and urging the engagement members of each contact away from one another as the top is moved toward the base to permit the leads to be installed in their corresponding contacts, whereby upon movement of the top away from the base the engagement members are released to yieldably engage the leads.

2. Socket as claimed in claim 1, wherein said base includes an elongated, uninterrupted slot extending along said one side of said integrated circuit when the latter is installed in the socket, said contacts being mounted on said base to extend into said slot transversely with respect thereto.

3. Socket as claimed in claim 2, wherein said base includes a pad extending below said integrated circuit when the latter is installed in the socket, each of said contacts including means engaging said pad to secure the contacts to the base.

4. Socket as claimed in claim 3, wherein said means engaging said pad includes a pair of barbs projecting from said engagement members of each contact, said barbs being received in a corresponding one of multiple apertures defined in said pad.

5. Socket as claimed in claim 1, wherein sad connecting member connects one end of each of said engagement members and the other end of each engagement member has a lip deflecting outwardly with respect to said gap, the width of said gap being substantially constant between the ends of said engagement members.

6. Socket as claimed in claim 5, wherein said lips extend from only a portion of the other end of each of said engagement members, said portions being offset from one another whereby said engagement members are permitted to deflect outwardly with respect to said gap without interfering with the lip of an adjacent engagement member.

7. Socket as claimed in claim 1, wherein each of said contacts includes a contact arm extending from said contact for engagement with a conductor within the circuit board.

8. Socket as claimed in claim 1, wherein said base includes an outer wall supporting said base and having an end surface clamped to said circuit board when the socket is installed on the circuit board, each of said contacts including a resilient contact arm extending from each contact and extending over said end surface and clamped between said end surface and the circuit board to effect electrical contact with a conductor of said circuit board.

9. Socket as claimed in claim 8, wherein said contact arms extend from the connecting members of the contacts.

10. Socket as claimed in claim 8, wherein said contact arms include a portion extending around said end surface and cooperating with the latter to define a gap therebetween before installation of the socket on the circuit board, said portion being compressed to close said gap when the socket is installed on the circuit board.

11. Socket as claimed in claim 10, wherein said contact arms have a lip at a distal end thereof, said lip extending beyond said end surface.

12. Socket as claimed in claim 1, wherein the width of said gap varies as the top is raised and lowered, said gap being the narrowest when said top is raised, and widest when said top is lowered, said spreader members having a body that is wider than the narrowest width of said gap, and said body defining the gap width when the top is lowered.

13. Socket as claimed in claim 12, wherein said engagement members have lips at a distal end thereof extending outwardly with respect to said gap, said spreader members including converging wedging surfaces extending from the body, said wedging surfaces engaging said lips as the top is lowered toward said base.

14. Socket as claimed in claim 13, wherein the width of said gaps being substantially constant between the ends of said engagement members.

15. A socket positioning and installing an integrated circuit on a circuit board, said integrated circuit having multiple, parallel leads extending from one side of the integrated circuit, said socket comprising a base, multiple electrically conductive contacts mounted on said base and electrically connected independently of the other contacts to the circuit board and including one contact for each of said leads, each of said contacts including a pair of resilient engagement members defining a gap therebetween for receiving a corresponding lead when the integrated circuit is installed in the socket, each of said engagement members having a lip deflecting outwardly with respect to said gap, said lips extending across only a portion of each engagement member, said portions being offset from one another in adjacent contacts whereby said engagement members are permitted to deflect outwardly with respect to said gap without interfering with the lip of an adjacent engagement member, and a top slidably mounted on said base and movable toward and away from said contacts, said top including electrically nonconductive spreader members engaging both of said engagement members of each contact and urging the engagement members of each contact away from one another as the top is moved toward the base to permit the leads to be installed in their corresponding contacts, whereby upon movement of the top away from the base the engagement members are released to yieldably engage the leads.

16. Socket as claimed in claim 15, wherein the width of said gap varies as the top is raised and lowered, said gap being the narrowest when said top is raised, and widest when said top is lowered, said spreader members having a body that is wider than the narrowest width of said gap, and said body defining the gap width when the top is lowered.

17. Socket as claimed in claim 15, wherein said spreader members include converging wedging surfaces extending from the body, said wedging surfaces engaging said lips as the top is lowered toward said base.

18. A socket positioning and installing an integrated circuit on a circuit board, said integrated circuit having multiple, parallel leads extending from one side of the integrated circuit, said socket comprising a base, multiple electrically conductive contacts mounted on said base and electrically connected independently of the other contacts to the circuit board and including one contact for each of said leads, each of said contacts including a pair of resilient engagement members defining a gap-therebetween whereby said pair of engagement members on each contact are separated from one another and a top slidably mounted on said base and movable toward and away from said contacts, said top including electrically nonconductive spreader members engaging both of said engagement members of each contact and urging the engagement members of each contact away from one another to increase the gap as the top is moved toward the base to permit the leads to be installed in their corresponding contacts, whereby upon movement of the top away from the base the engagement members are released to yieldably engage the leads, said base including an outer wall supporting said base and having an end surface clamped to said circuit board when the socket is installed on the circuit board, each of said contacts including a resilient contact arm extending from each contact and extending over said end surface and clamped between said end surface and the circuit board to effect electrical contact with a conductor of said circuit board.

19. Socket as claimed in claim 18, wherein said contacts include a connecting member connecting said engagement members, said contact arms extending from the connecting members of the contacts.

20. Socket as claimed in claim 18, wherein said contact arms include a portion extending around said end surface and cooperating with the latter to define a gap therebetween before installation of the socket on the circuit board, said portion being compressed to close said gap when the socket is installed on the circuit board.

21. Socket as claimed in claim 20, wherein said contact arms have a lip at a distal end thereof said lips extending beyond said end surface.

22. A socket positioning and installing an integrated circuit on a circuit board, said integrated circuit having multiple parallel leads extending from one side of the integrated circuit, said socket comprising a base; multiple electrically conductive contacts mounted on said base and electrically connected independent of the other contacts to the circuit board and including one contact for each of said leads, each of said contacts including a pair of resilient engagement members and a connecting member connecting said engagement members, each of said engagement members including a base portion a laterally extending portion and an upwardly extending arm, each of said arms having an outwardly projecting lip extending along a distal end thereof; and a top slidably mounted on said base and movable toward and away from said contacts, said top including electrically non-conducting spreader members engaging both of said engagement members of each contact and urging said engagement members of each contact away from one another as said top is moved toward the base to permit the leads to be installed in their corresponding contacts.

23. Socket as claimed in claim 22, wherein said lip extends along only a portion of the distal end of one of said arms on each contact.

24. Socket as claimed in claim 23, wherein said contact includes a contact arm extending laterally from said connecting member.

25. A contact for making an electrical connection between two members comprising a pair of engagement members; a connecting member connecting said engagement members; and a contact arm, each of said engagement members including a laterally extending portion and an upwardly extending arm, each of said upwardly extending arms having an outwardly extending lip, said lip extending along only a portion of one of said arms, said contact arm extending laterally from said connecting member in a direction substantially parallel to said laterally extending portions of said engagement members.

26. Contact as set forth in claim 25, wherein said upwardly extending arms are offset from one another.

* * * * *

UNITED STATES PATENT AND TRADEMARK OFFICE
CERTIFICATE OF CORRECTION

PATENT NO. : 6,162,080

DATED : December 19, 2000

INVENTOR(S) : Valts E. Treibergs et al.

It is certified that error appears in the above-identified patent and that said Letters Patent are hereby corrected as shown below:

Claim 5, Line 1, [sad] -- said --

Claim 18, Line 64, delete hyphen between the words "gap" and "therebetween"

Signed and Sealed this

Eighth Day of May, 2001

Attest:

NICHOLAS P. GODICI

Attesting Officer

*Acting Director of the United States Patent and Trademark Office*